United States Patent
Pang

(10) Patent No.: US 8,111,898 B2
(45) Date of Patent: Feb. 7, 2012

(54) METHOD FOR FACILITATING AUTOMATIC ANALYSIS OF DEFECT PRINTABILITY

(75) Inventor: Linyong Pang, Castro Valley, CA (US)

(73) Assignee: Synopsys, Inc., Mountain View, CA (US)

( * ) Notice: Subject to any disclaimer, the term of this patent is extended or adjusted under 35 U.S.C. 154(b) by 1919 days.

(21) Appl. No.: 10/313,706

(22) Filed: Dec. 6, 2002

(65) Prior Publication Data

US 2004/0109601 A1 Jun. 10, 2004

(51) Int. Cl.
*G06K 9/00* (2006.01)
(52) U.S. Cl. ........................................ 382/141
(58) Field of Classification Search .......... 382/115–124, 382/141–152
See application file for complete search history.

(56) References Cited

U.S. PATENT DOCUMENTS

| | | | |
|---|---|---|---|
| 5,146,509 A * | 9/1992 | Hara et al. | 382/149 |
| 5,761,336 A * | 6/1998 | Xu et al. | 382/141 |
| 5,999,658 A * | 12/1999 | Shimazu et al. | 382/266 |
| 6,021,214 A * | 2/2000 | Evans et al. | 382/141 |
| 6,222,936 B1 * | 4/2001 | Phan et al. | 382/149 |
| 6,252,981 B1 * | 6/2001 | Guest et al. | 382/149 |
| 6,463,163 B1 * | 10/2002 | Kresch | 382/103 |
| 6,701,004 B1 * | 3/2004 | Shykind et al. | 382/149 |
| 2002/0164065 A1 | 11/2002 | Cai et al. | |
| 2003/0048957 A1 * | 3/2003 | Dai et al. | 382/260 |
| 2003/0228051 A1 * | 12/2003 | Gleason et al. | 382/149 |

OTHER PUBLICATIONS

"Fractal Image Compression", Siggraph '92 Course Notes; Yuval Fisher; pp. 1-21.

* cited by examiner

*Primary Examiner* — Alex Liew
(74) *Attorney, Agent, or Firm* — Bever, Hoffman & Harms, LLP; Jeanette S. Harms

(57) ABSTRACT

Defect printability analysis in a mask or wafer requires the accurate identification of defect images and reference (i.e. defect-free) images, in particular for a die-to-die inspection mode. A method of automatically distinguishing a reference image from a defect image is provided. In this method, multiple images can be accessed and aligned. Then, a common area of the multiple images can be defined. At this point, a complexity of each of the images, as defined by the common area, can be computed. Advantageously, by comparing the complexity of the multiple images, the reference and defect images can be quickly and accurately designated. Specifically, the most complex image is designated the defect image because the defect image must describe the defect. Complexity can be computed using various techniques.

12 Claims, 6 Drawing Sheets

METHOD FOR FACILITATING AUTOMATIC ANALYSIS OF DEFECT PRINTABILITY

BACKGROUND OF THE INVENTION

1. Field of the Invention

A method is provided for improving automatic analysis of defect printability on a mask or wafer. Specifically, identification of defect versus reference images can be done quickly and accurately in a die-to-die inspection mode, thereby providing an optimized analysis.

2. Discussion of the Related Art

In high-density IC designs, those skilled in the art of integrated circuit fabrication have recognized the importance of using masks that provide accurate representations of the original design layout. Unfortunately, a "perfect" mask is not commercially viable. In fact, even under optimal manufacturing conditions, some mask defects can occur outside the controlled process.

A defect on a mask is any deviation from the design database (i.e. an irregularity) that is deemed unacceptable by an inspection tool or an inspection engineer. A mask defect printability system designed by Numerical Technologies, Inc. provides mask quality assessment without resorting to an actual exposure of a wafer. This mask defect printability system is described in U.S. patent application Ser. No. 09/814,023 (herein referenced as the NTI system), entitled, "System and Method of Providing Mask Defect Printability Analysis", which was filed on Mar. 20, 2001 and is incorporated by reference herein.

In the NTI system, a physical mask and a corresponding, defect-free reference image are inspected. This inspection identifies any defects of the physical mask compared to the reference image. If a defect is identified, a defect area image of the defect and the area surrounding the defect from the physical mask as well as the corresponding area image from the reference image are provided to a wafer image generator. The wafer image generator generates simulations of the image data, i.e. for the physical mask and reference image.

In one embodiment, a defect printability analysis generator receives the simulated wafer images of the physical mask and the reference image from the wafer image generator. The two simulated wafer images can be aligned in a pre-processing operation. Alignment can be done using alignment keys having predetermined coordinates on the mask as well as defect free patterns on the mask. When these coordinates and patterns are aligned, the features provided on those masks (as well as on wafer images of those masks) are also aligned.

After alignment, defect analysis on the simulated wafer images can be done. In one embodiment, the defect printability analysis generator can output a defect severity score (DSS) in an impact report. This impact report can be used to reduce human error in defect printability analysis. For example, perhaps a predetermined DSS score could indicate that the printed features (as simulated by the NTI system) would have significant performance issues, but that repair of the physical mask is possible. On the other hand, perhaps a higher DSS score than above could indicate not only performance issues, but that re-fabrication of the physical mask is recommended. Thus, by providing a numerical result having an associated meaning for each number, a technician can proceed efficiently and without error to the next action, e.g. repair of the physical mask or re-fabrication of the physical mask.

Of importance, the defect-free reference image used in the defect printability analysis can be one of the following: a simulated image of the layout of the physical mask or a defect-free area of the physical mask having the same pattern. When the reference image is a layout, the simulated image can easily be identified as the reference (versus defect) image because of its source (that is, the layout is assumed to be defect-free). However, when two mask images captured from a die-to-die inspection mode are used in defect analysis, the question arises as to which image is the reference image. Unfortunately, misidentification of the reference image can adversely impact the accuracy of the defect severity score provided in the impact report. Therefore, a need arises for a quick, accurate, and automatic method of distinguishing defect and reference images.

SUMMARY OF THE INVENTION

Defect printability analysis in a mask or wafer requires the accurate identification of a defect image versus a reference (i.e. defect-free) image. Currently, if the images are both from a mask or wafer, then an operator must review the images and make this identification manually. Unfortunately, because of operator unavailability or level of experience, the mask or wafer may be taken out of its fabrication line for later or further analysis, thereby undesirably increasing the overall manufacturing cost of the mask or wafer.

Therefore, a method of automatically distinguishing a reference image from a defect image is provided. In this method, multiple images can be accessed and aligned. In one embodiment, alignment keys (i.e. identifying marks on the mask/wafer) can be used to roughly align the images. In another embodiment, circuit features in the images can be used in conjunction with the alignment keys, thereby providing a high accuracy alignment.

Then, a common area of the multiple images can be defined. In other words, any edges of the images that do not overlap are "cut" (i.e. ignored), thereby ensuring that only the common (i.e. overlapping) area of the images is analyzed. At this point, a complexity of each of the images, as defined by the common area, can be computed. Advantageously, by comparing the complexity of the multiple images, the reference and defect images can be quickly and accurately designated.

Specifically, the more complex image is designated the defect image because the defect image must describe the defect. In contrast, the reference image is the less complex image because it does not need to describe the defect. Complexity can be computed using various techniques.

In one embodiment, computing the complexity can include performing at least a portion of a spatial frequency transform.

The spatial frequency transform can include, for example, generating a Fourier transform, generating a JPEG file, or computing a fractal. In these transforms, information regarding an image can be compressed based on repeating frequencies, blocks, and patterns. An image with at least one more frequency, block, or pattern than another image would be considered more complex. Thus, in one embodiment, the spatial frequency transform, which could include resource intensive computation to complete, is only performed until the additional frequency, block, or pattern is identified.

In another embodiment, computing the complexity can include performing a set of steps for partitioning. In partitioning, an image is divided into a predetermined number (e.g. four) blocks at a first level. If matching blocks are identified at the first level, then those blocks are not divided further. Non-matching blocks are then divided into the same predetermined number of blocks. Matching second-level blocks are searched for within their respective first-level blocks. An image is fully partitioned when all blocks have a match at some level. In one embodiment, because partitioning can also include resource intensive computation to complete, partitioning need only be performed until one block is identified in one image as partitionable, but not the corresponding block in the other image.

In one embodiment, determining the complexity of a mask image that has optical proximity correction (OPC) features may include the same techniques with a different approach. Specifically, OPC features are not meant to print, but are used to improve the printing of certain circuit features. Thus, at a mask level, a defect that reduces the size of an OPC feature could inadvertently result in the designation of that image as a reference image instead of a defect image. Therefore, in one embodiment, determining the complexity of a mask image that has OPC features can include simulating wafer images. In this embodiment, the simulated wafer image having the more complex contours is associated with the defect image.

A program storage device readable by a machine is also provided. The program storage device can tangibly embody a program of instructions executable by the machine to perform method steps to analyze a lithographic medium. The lithographic medium can refer to a mask or a wafer. The method can include accessing multiple images of the lithographic medium, aligning the multiple images, defining a common area of the multiple images, computing a complexity of each of the images (as defined by the common area), and designating the reference and defect images by comparing the complexity of the multiple images.

A computer program product can also be provided. The computer program product includes a computer usable medium having a computer readable program code embodied therein for causing a computer to analyze a lithographic medium for defects. The computer readable program code includes computer readable program code for accessing multiple images of the lithographic medium, computer readable program code for aligning the multiple images, computer readable program code for defining a common area of the multiple images, computing a complexity of each of the images (as defined by the common area), and computer readable program code for designating the reference and defect images by comparing the complexity of the multiple images.

A system for analyzing a lithographic medium for defects can also be provided. The system can include means for accessing multiple images of the lithographic medium, means for aligning the multiple images, means for defining a common area of the multiple images, means for computing a complexity of each of the images, as defined by the common area, and means for designating the reference and defect images by comparing the complexity of the multiple images. In one embodiment, the lithographic medium is a mask. In another embodiment, the lithographic medium is a wafer.

DETAILED DESCRIPTION OF THE FIGURES

A quick and accurate technique for distinguishing defect and reference images is provided. This technique can advantageously be used to fully automate defect printability analysis. The technique can be applied to masks (for simplicity, the term "masks" can refer to either masks or reticles) as well as wafers.

In accordance with one aspect of the technique, the complexity of each of the two images can be computed. These values are then compared. Because the defect image includes the defect, it is typically more complex than that of the reference image. In other words, the addition of a defect, irrespective of its shape and size, would typically result in a more complex image compared to the reference (i.e. defect-free) image.

Figure 1:
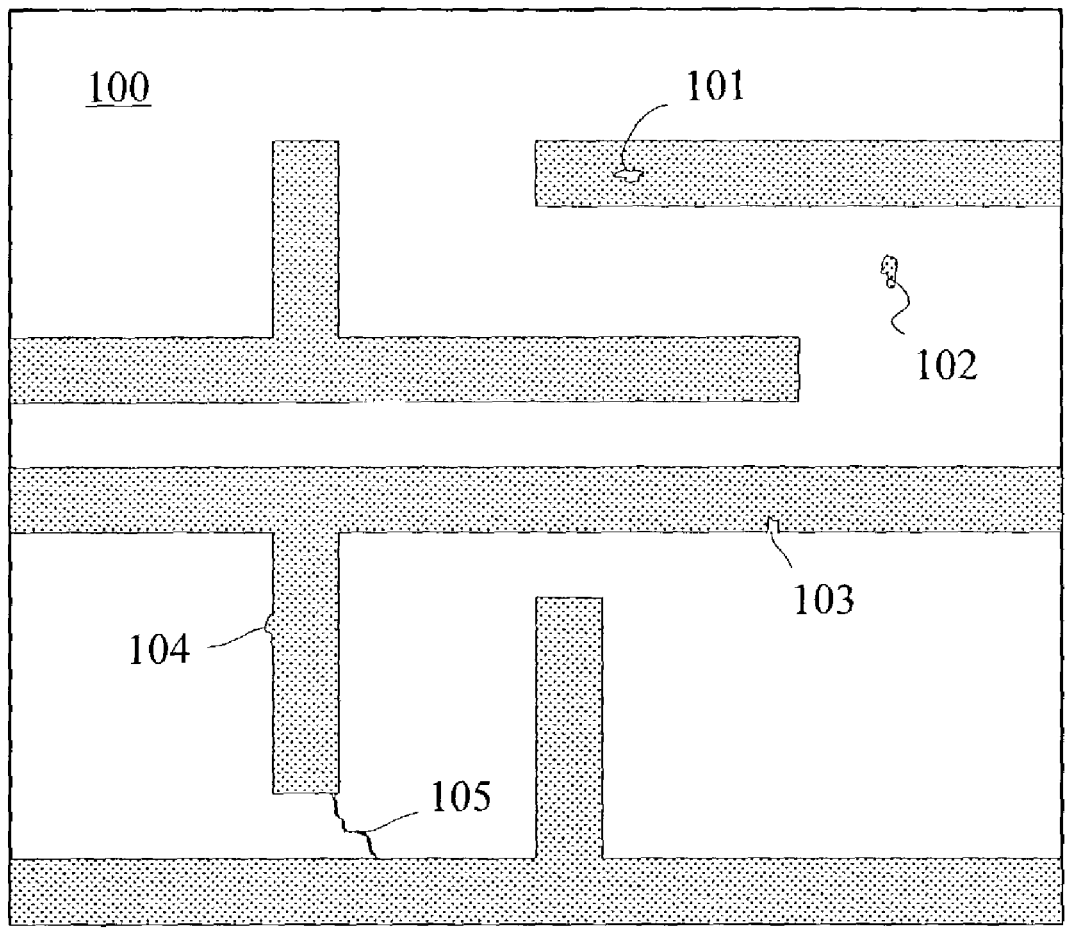
FIG. 1 illustrates common types of defects that could be present on a bright field mask, such as a pinhole, a pin dot, an intrusion, a protrusion, and a geometry bridge.

FIG. 1 illustrates common types of defects that could be present on a bright field mask 100. A pinhole 101, one type of defect, can be formed as a small transparent shape in what should be an opaque portion of mask 100. A pin dot 102, another type of defect, can be formed as a small opaque shape in what should be a transparent portion of mask 100. An intrusion 103, yet another type of defect, is a small portion missing from a desired opaque shape on mask 100. A protrusion 104, yet another type of defect, is a small additional portion that extends beyond the desired opaque shape on mask 100. A geometry bridge 105, yet another type of defect, is an opaque shape that undesirably connects two opaque features on mask 100. Similar types of defects could be present in a dark field mask. Note that, as described herein, defects are the result of random conditions (e.g. impurities, fabrication anomalies, etc.), not systematic problems (e.g. improper settings/parameters provided to the mask fabrication equipment etc.).

Various methods can be used to compute the complexity of the defect and reference images. Most of these methods compare compressed files of the images, rather than native files of the images. A native file format refers to a default file format used by a specific software application. Native files can include raw data, e.g. a bitmap including a plurality of pixels, of the image. In this case, assuming the same number of pixels is analyzed, the size of the defect and reference images would be the same. However, to minimize storage, native files of the images can be compressed. Advantageously, after compression, the stored native file of the defect image should be larger than that of the stored reference image because the information describing the defect cannot be compressed or, alternatively, is less efficiently compressed.

In another embodiment, spatial frequency transforms can be used to determine the complexity of the two images. One type of spatial frequency transform is a Fourier transform, which represents the image as a sum of complex exponentials of varying magnitudes, frequencies, and phases. A Fourier Transform (FFT) is used to transform the data into a complex image that emphasizes the frequency distributions. The forward FFT produces an image that shows both the horizontal and vertical spatial frequency components. The FFT image is actually composed of real and imaginary components, which can be represented in another way with magnitude and phase.

In general, the low frequency terms usually represent the general shape of the image and the high frequency terms are needed to sharpen the edges and provide fine detail. Looking at the frequency domain image is not usually instructive, but it is sometimes useful to observe the power spectrum of the frequency domain image.

The power spectrum is a plot of the magnitude of the various components of the frequency domain image. Different frequencies are represented at different distances from the origin (usually represented as the center of the image) and different directions from the origin represent different orientations of features in the original image. The average brightness value of the image (zero frequency component) is shown in the center of the transformed image. Pixels away from the center represent increasing spatial frequency components of the image. The power at each location shows how much of that frequency and orientation is present in the image. The power spectrum magnitude is usually represented on a log scale, since power can vary dramatically from one frequency to the next.

Figure 2A:
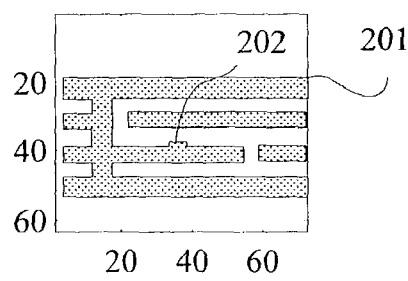
FIG. 2A illustrates an exemplary defect image including a protrusion defect.
Figure 2B:
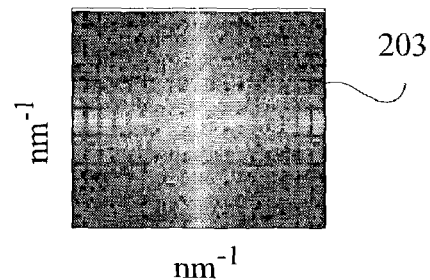
FIG. 2B illustrates a Fast Fourier Transform (FFT) representation of the defect image of FIG. 2A.
Figure 2C:
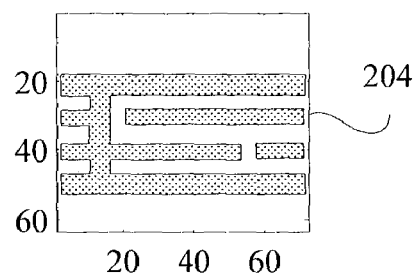
FIG. 2C illustrates a reference image corresponding to the defect image of FIG. 2A.
Figure 2D:
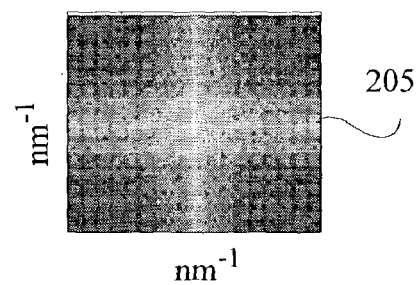
FIG. 2D illustrates a FFT representation of the reference image of FIG. 2C.
Figure 2E:
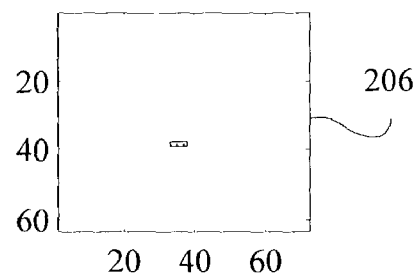
FIG. 2E illustrates an image that represents the difference between the defect image of FIG. 2A and the reference image of FIG. 2C.
Figure 2F:
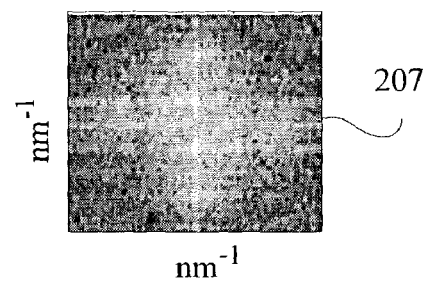
FIG. 2F illustrates a FFT representation of the image of FIG. 2E.

For example, FIG. 2A illustrates an exemplary defect image 201 (wherein 20, 40, and 60 indicate pixel positions on the image) including a defect 202 (i.e. a protrusion defect). FIG. 2B is a power spectrum plot, which illustrates the magnitude of spectrum, not the phase of spectrum, of FFT representation 203 of defect image 201. (Note that in the graphical FFT representations of FIGS. 2B, 2D, and 2E, minimum/maximum spectrum values are from $-3.333 \times 10^{-3}$ nm$^{-1}$ to $3.333 \times 10^{-3}$ nm$^{-1}$ (based on a pixel size on images 201, 204, and 206 of 150 nm, and the dimensions of those images being 72 pixels by 64 pixels)). FIG. 2C illustrates a reference image 204 corresponding to defect image 201. FIG. 2D illustrates a FFT representation 205 of reference image 204. FIG. 2E illustrates an image 206 that represents the difference between images 201 and 204. FIG. 2F illustrates a FFT representation 207 of image 206.

Due to the presence of defect in the defect image, the FFT representation of the defect image is different from the FFT representation of the reference image. Specifically, higher frequencies or larger values of high frequencies can appear on the FFT representation of the defect image compared to the FFT representation of the reference image. Therefore, when the FFT representation of the defect image (FIG. 2B) is subtracted from the FFT representation of the reference image (FIG. 2C), positive values in the high frequency domain (away from the center, which is zero frequency) can be observed on the difference image (FIG. 2D). Those additional positive values in the high frequency domain indicate that the image of FIG. 2A is more complex than the image of FIG. 2C, thereby implying that the image of FIG. 2A is the defect image and the image of FIG. 2C is the reference image.

Another type of spatial frequency transform is a discrete cosine transformation, such as that used in JPEG formats. In a JPEG format, pixels of an image can be grouped into blocks (e.g. 8×8, 16×16, etc.). Each block of pixels can be transformed into another domain to generate a set of transform coefficients. These transform coefficients, which represent the spatial frequency components making up the block, can then be coded and stored.

The JPEG file includes the coefficients for unique blocks as well as references to instances of those blocks. For example, assume a checkerboard is divided into blocks matching its black and white squares. In this case, the JPEG file for the reference image of the checkerboard would include the coefficients describing the two unique blocks (i.e. the white square and the black square) and references to the instances of those two blocks.

In the case of a JPEG file, the defect image would require one or more additional unique blocks compared to the reference image to describe the defect. Therefore, the file size of a defect image would be larger than that of a reference image. For example, an exemplary protrusion defect image. (72×64 pixels) could be stored as a JPEG file having a size of 2812 bytes. In contrast, its corresponding reference image (also 72×64 pixels) could be stored as a JPEG file having a size of 2536 bytes (assuming the same compression parameters are used). In another example, an exemplary intrusion defect image (64×64 pixels) could be stored as a JPEG file having a size of 2355 bytes. In contrast, its corresponding reference image (also 64×64 pixels) could be stored as a JPEG file having a size of 2251 bytes (once again, assuming the same compression parameters are used).

Of importance, although the generation of a JPEG file can require significant computational resources, not all steps may be necessary to determine the complexity of the image. For example, in the case of the checkerboard, merely determining the number of unique blocks would be sufficient to distinguish the reference image from the defect image. Specifically, the block(s) including the defect would result in one or more additional unique blocks. Thus, in one embodiment, some computationally intensive steps for generating the JPEG files do not need to be performed while still ensuring an accurate complexity determination.

Yet another type of spatial frequency transform is fractal analysis. In fractal theory, all images can be generated from a limited number of patterns, which are subject to rotation, scaling, and displacement. In other words, mathematical transformations regarding these patterns can be used to map sub-regions of an image to other similar sub-regions within the same image. Compression using fractal imaging is described in further detail in "Fractal Image Compression", by Yuval Fisher, published by Siggraph in 1992.

In accordance with one embodiment, anomalous sub-regions can be used to identify the defect image. Specifically, fractal encoding can include identifying shapes in the mask and describing those shapes as fractals of a particular order. In one embodiment, the analyzed image could be divided using a grid pattern, wherein shapes within each grid and between grids can be measured. Note that the computation of the fractal encoding can also be computationally intensive. Therefore, in one embodiment, the image complexity can be determined using a subset of the total number of steps for generating the fractal encoding. For example, only the number of basic shapes and the total number of grids that are generated from the basic shape need be counted. Therefore, in one embodiment, the step to actually generate the compressed image can be eliminated.

Figure 3A:
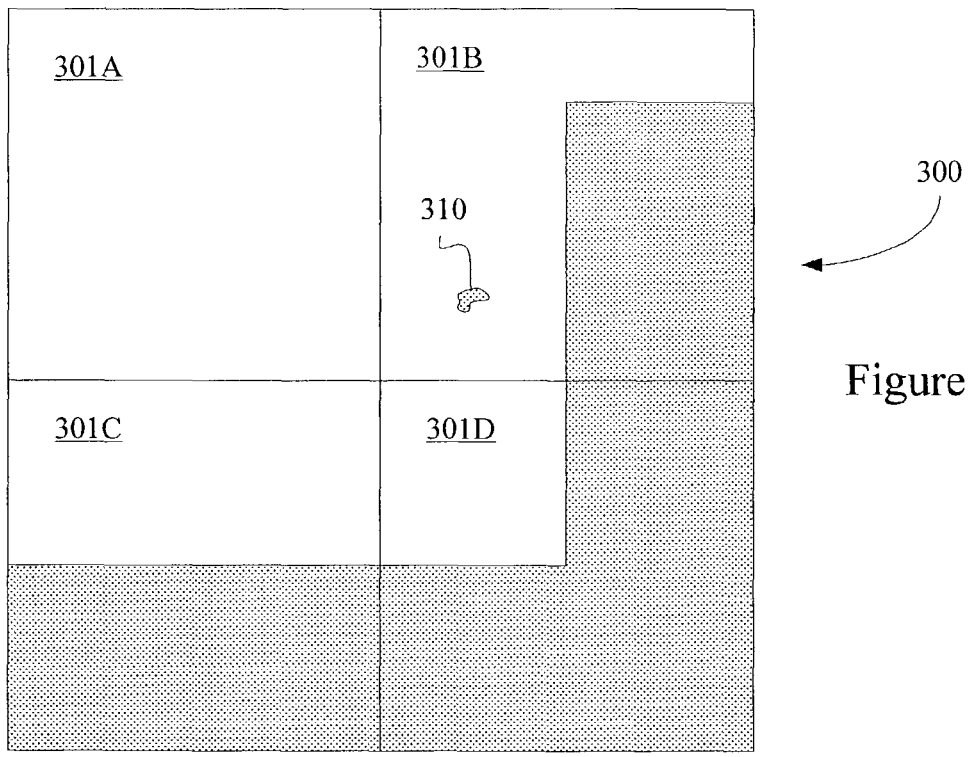
FIGS. 3A-3C illustrate an exemplary partitioning of a defect image.
Figure 3B:
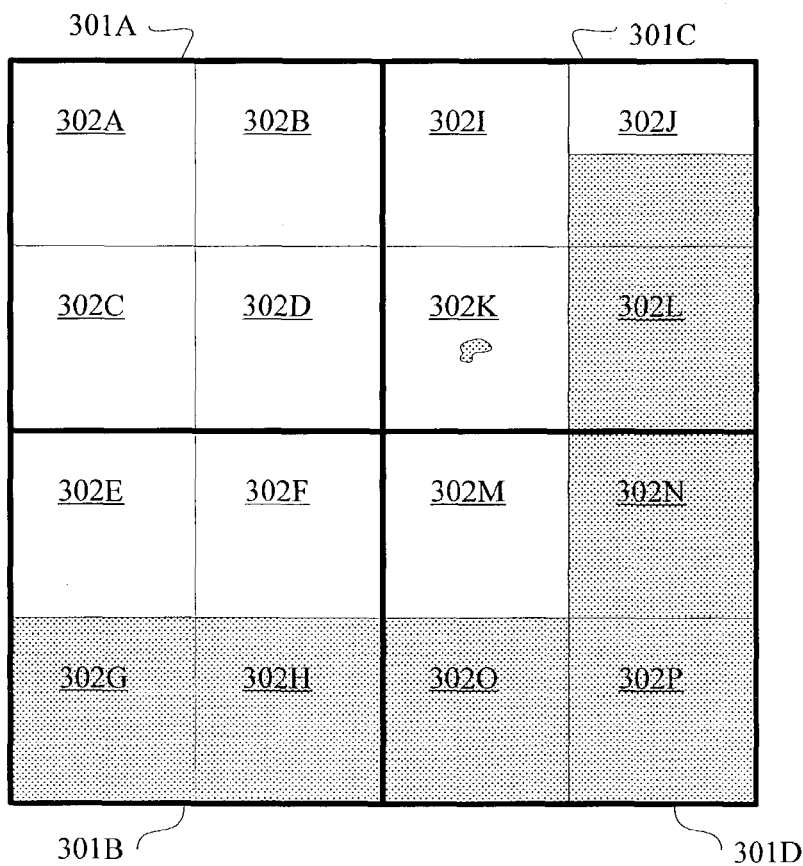
Figure 3C:
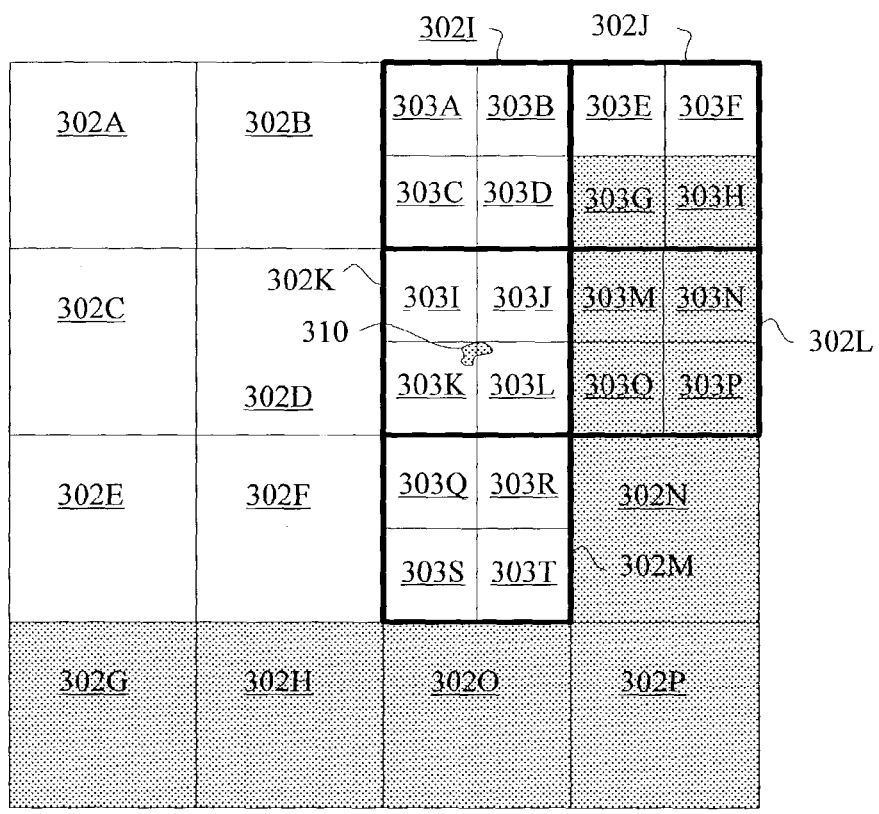

In another embodiment, partitioning can be used to determine image complexity. FIGS. 3A-3C illustrate an exemplary partitioning of a defect image. Specifically, as shown in FIG. 3A, a defect image 300, which includes a defect 310, can be divided into 4 large blocks (301A, 301B, 301C, and 301D, collectively 301) during a first partitioning stage. After division, identical (or substantially similar) large blocks 301 can be identified. In this case, all four large blocks 301 are unique. Therefore, further partitioning can be performed.

As shown in FIG. 3B, each of the previous large blocks 301 of defect image 300 can be further divided into 4 additional medium blocks, thereby creating medium blocks 302A-302P (collectively 302) during a second partitioning stage. At this point, identical medium blocks within each large block can be identified. Thus, for example, medium blocks 302A-302D in large block 301A can be identified as identical. Therefore, medium blocks 302A-302D in large block 301A need not be partitioned further. Similarly, medium blocks 302E/302F, 302G/302H, and 302N/302O/302P can be identified as identical within their respective large blocks. Therefore, medium blocks 302E-302H and 302N-302P need not be partitioned further.

In contrast, medium blocks 302I, 302J, 302K, 302L, and 302M have no duplicate blocks within their respective large block 301 and therefore can be partitioned further. As shown in FIG. 3C, each of medium blocks 302I, 302J, 302K, 302L, and 302M can be further divided into 4 additional small blocks, thereby creating small blocks 303A-303T (collectively 303) during a third partitioning stage. At this point, identical small blocks within each medium block can be identified, except for small blocks 303K and 303K, which need further partitioning. Note that partitioning will stop when either no further partitioning is needed or the process reaches a predetermined limit (which could be set by a user).

Note that a reference image not including defect 310 would not need to be further partitioned because all small blocks would have duplicates within their respective medium blocks. However, in defect image 301, further partitioning can be performed on small blocks 303K and 303L, both of which include portions of defect 310. Therefore, even without actually partitioning further, the defect image can be distinguished from the reference image because it will have more blocks (wherein the final number after complete partitioning is unnecessary to compute).

Figure 4:
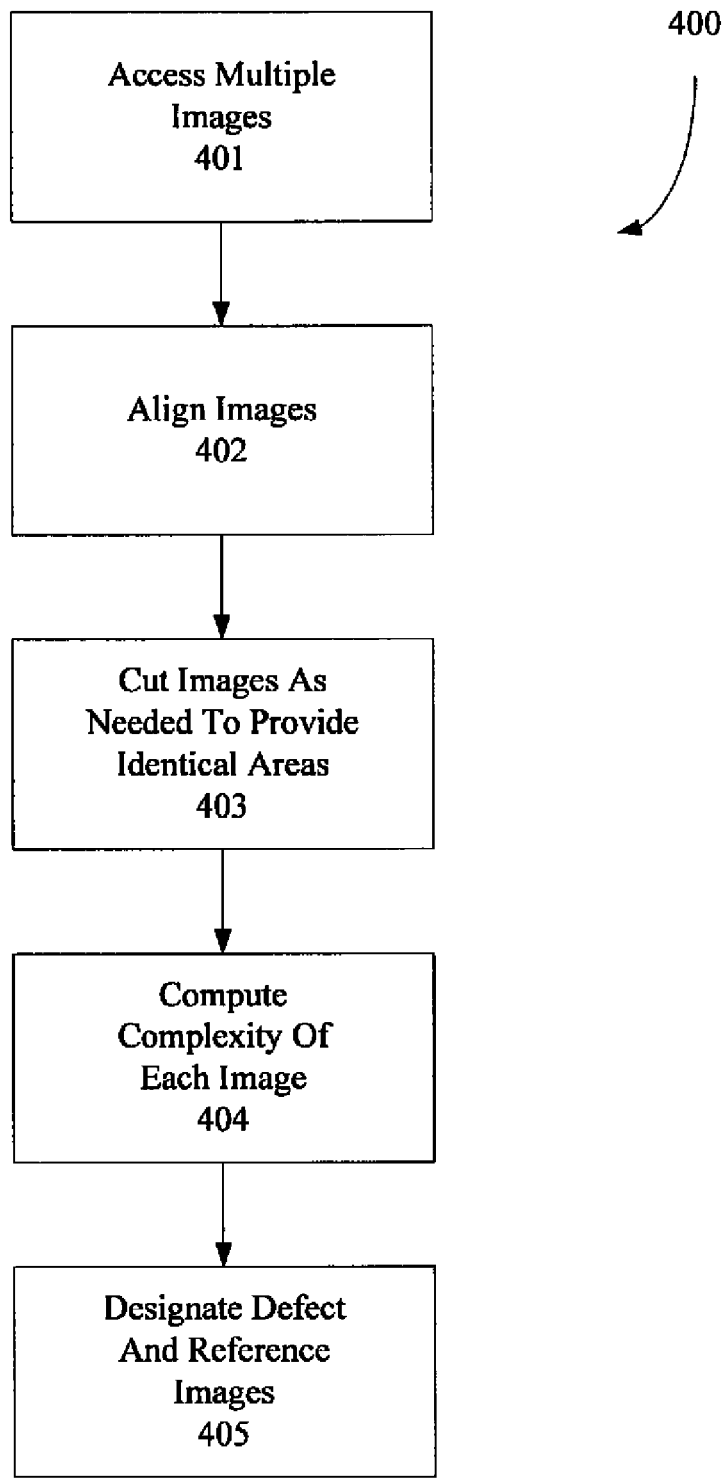
FIG. 4 illustrates an automated process for accurately distinguishing defect and reference images.

FIG. 4 illustrates an automated process 400 for accurately designating the defect image and the reference image. In step 401, multiple images (e.g. two) can be accessed. Accessing could include using an image acquirer, e.g. a high resolution optical microscope, a scanning electron microscope (SEM), an in-line inspection system, an atomic force microscope, or a near-field optical microscope, to scan all or a portion of a mask. Alternatively, accessing could include interfacing with a storage device that is storing digital images taken of the mask by the image acquirer. The storage device could store the images in one or more formats, such as in Windows® BMP. In step 402, the images can be aligned to ensure that the same area is being analyzed. In one embodiment, the alignment keys as well as features on the images can be used to provide high accuracy alignment. In step 403, one or both images can be "cut" to provide identical areas for analysis. In other words, any peripheral portions of the images not overlapping should not be considered during analysis. In step 404, the complexity of the multiple images can be computed. The complexity can be computed using any type of spatial frequency transform (e.g. Fourier, JPEG, fractal, etc.) or partitioning. Other known techniques for computing complexity can also be used. After the complexity is computed, the defect and reference images can be designated. In the embodiments described above, the most complex of the multiple mask images can be designated as the defect image (and conversely, the least complex of the multiple images can be designated as the reference image). Note that certain types of masks may need different and/or further analysis.

Figure 5A:
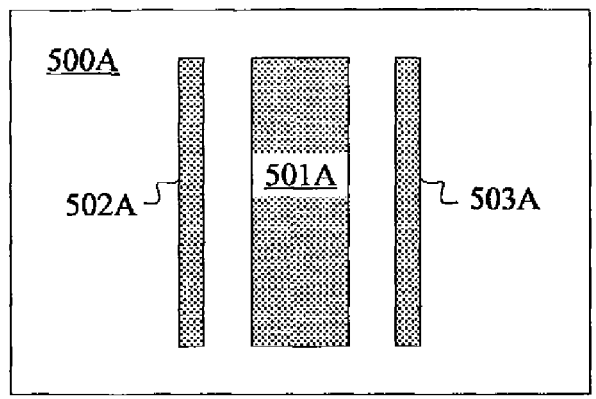
FIG. 5A illustrates a reference image including a circuit feature and two corresponding assist bars.
Figure 5B:
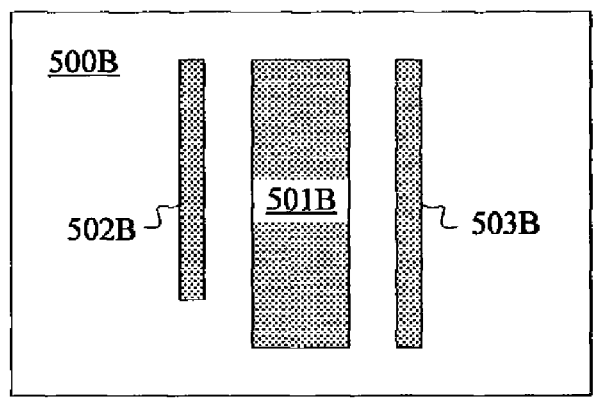
FIG. 5B illustrates a defect image including a circuit feature, similar to that of FIG. 5A, and two corresponding assist bars, wherein one assist bar includes a defect.

For example, in more complicated and dense circuits in which the size of the circuit features approach the optical limits of the lithography process, a mask may also include sub-wavelength, optical proximity correction (OPC) features, such as serifs, hammerheads, bias, and assist bars, which were designed to compensate for proximity effects. FIGS. 5A and 5B illustrate corresponding reference and defect images of a bright field mask, which includes OPC features.

Specifically, FIG. 5A illustrates a reference image 500A including a circuit feature 501A and two corresponding assist bars 502A and 503A. Assist bars 502A and 503A are too small to print themselves, but improve the printing of circuit feature 501A. Note that a defect could affect a circuit feature as well as an OPC feature. For example, shown in FIG. 5B, a defect could reduce the size of an assist feature 502B, which should work in combination with an assist feature 503B to improve the printing of circuit feature 501B.

Of importance, if analysis of complexity is performed at the mask level, then reference image 500A could be mistaken for the defect image (which should be defect image 500B). In other words, the larger assist feature, i.e. assist feature 502A, would not compress as small as assist feature 502B. Thus, reference image 500A could erroneously be designated the defect image and defect image 500B could erroneously be designated the reference image.

Figure 5C:
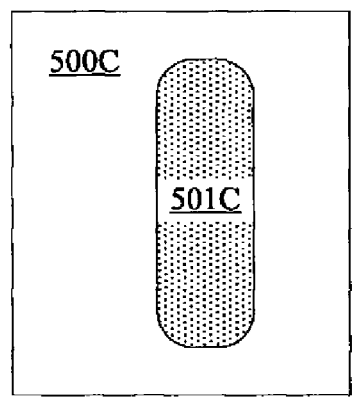
FIGS. 5C and 5D illustrate simulated wafer images of the reference image of FIG. 5A and the defect image of FIG. 5B, respectively.
Figure 5D:
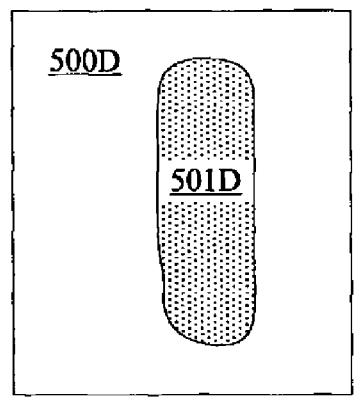

Therefore, in one embodiment in which the mask includes OPC features, step 404 (FIG. 4) of process 400 can include simulating a wafer image for the reference and defect images. For example, FIGS. 5C and 5D illustrate simulated wafer images 500C and 500D of images 500A and 500B, respectively. Note that compared to reference image 500A, simulated wafer image 501C has some corner rounding, but still indicates an acceptable transfer of circuit feature 501A to the wafer. In contrast, simulated wafer image 501D has some significant irregularities, particularly in the area associated with the defect in assist bar 502B (i.e. the lower left corner of circuit feature 501D). Thus, in one embodiment, step 405 (FIG. 4) can then include determining the regularity of the simulated features, wherein the more regular simulated feature would be associated with the reference image. Note that defects affecting other OPC features (e.g. hammerheads, serifs, etc.) could be analyzed in a similar manner.

In cases where the complexity of the two images is substantially identical, one or more additional images can be analyzed. For example, if images A and B have substantially similar complexity, then another image C taken from another portion of the mask can also be analyzed. Specifically, the complexity of images A/B, A/C, and B/C can be compared. If both images A and C are less complex than image B, even on a very small scale, then image B is probably the defect image. Logically, the larger the number of images, the more robust the process.

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, a program storage device readable by a machine can also be provided. The program storage device can tangibly embody a program of instructions executable by the machine to perform method steps to analyze a lithographic medium. The lithographic medium can refer to a mask or a wafer. The method can include the steps shown in process 400 of FIG. 4 (i.e. accessing multiple images of the lithographic medium, aligning the multiple images, defining a common area of the multiple images, computing a complexity of each of the images (as defined by the common area), and designating the reference and defect images by comparing the complexity of the multiple images).

A computer program product can also be provided. The computer program product includes a computer usable medium having a computer readable program code embodied therein for causing a computer to analyze a lithographic medium for defects. The computer readable program code includes computer readable program code for performing the steps shown in process 400 of FIG. 4. Specifically, computer readable program code includes computer readable program code for accessing multiple images of the lithographic medium, computer readable program code for aligning the multiple images, computer readable program code for defining a common area of the multiple images, computing a complexity of each of the images (as defined by the common area), and computer readable program code for designating the reference and defect images by comparing the complexity of the multiple images.

A system for analyzing a lithographic medium for defects can also be provided. The system can include means for accessing multiple images of the lithographic medium, means for aligning the multiple images, means for defining a common area of the multiple images, means for computing a complexity of each of the images, as defined by the common area, and means for designating the reference and defect images by comparing the complexity of the multiple images.

Accordingly, it is intended that the scope of the invention be defined by the following claims and their equivalents.

The invention claimed is:

1. A method of automatically distinguishing a reference image from a defect image, the method comprising:
   using a mask defect printability system,
   accessing multiple images, the multiple images being undesignated as reference or defect images;
   aligning the multiple images;
   defining a common area of the multiple images;
   computing a complexity of each of the images, as defined by the common area, by performing at least a portion of a spatial frequency transform, the spatial frequency transform including generating a Fourier transform (FFT); and
   designating the reference and defect images by comparing the complexity of each of the multiple images,
   wherein higher frequencies or larger values of high frequencies appear on an FFT representation of the defect image compared to an FFT representation of the reference image, wherein subtracting FFT representations of the multiple images from each other results in difference images, and wherein a difference image having more positive values in a high frequency domain identifies a defect image.

2. A method of automatically distinguishing a reference image from a defect image, the method comprising:
   using a mask defect printability system,
   accessing multiple images, the multiple images being undesignated as reference or defect images;
   aligning the multiple images;
   defining a common area of the multiple images;
   computing a complexity of each image, as defined by the common area, by performing at least a portion of a spatial frequency transform, the spatial frequency transform including generating a JPEG file; and
   designating the reference and defect images by comparing the complexity of each of the multiple images,
   wherein generating the JPEG file includes grouping pixels of each image into blocks, each block of pixels being transformed into another domain to generate a set of transform coefficients, which indicate unique blocks and instances of blocks, and
   wherein a defect image has one or more additional unique blocks compared to a reference image.

3. A method of automatically distinguishing a reference image from a defect image, the method comprising:
   using a mask defect printability system,
   accessing multiple images, the multiple images being undesignated as reference or defect images;
   aligning the multiple images;
   defining a common area of the multiple images;
   computing a complexity of each image, as defined by the common area, by performing a set of steps for partitioning; and
   designating the reference and defect images by comparing the complexity of each of the multiple images,
   wherein partitioning includes dividing each image into blocks, the blocks being equal-sized, wherein duplicated blocks are exempt from further partitioning, wherein each unduplicated block is further partitioned into smaller blocks, the smaller blocks being equal-sized, wherein duplicated smaller blocks are exempt from further partitioning, wherein the partitioning continues until the reference image and the defect image are distinguished, each further partitioning having yet smaller blocks,
   wherein a defect image has a greater total number of all size blocks than a reference image.

4. A non-transitory program storage device readable by a machine, tangibly embodying a program of instructions executable by said machine to perform method steps to analyze a lithographic medium, the method steps comprising:
   accessing multiple images of the lithographic medium, the multiple images being undesignated as reference or defect images;
   aligning the multiple images;
   defining a common area of the multiple images;
   computing a complexity of each of the images, as defined by the common area, by performing at least a portion of a spatial frequency transform, the spatial frequency transform including generating a Fourier transform (FFT); and
   designating the reference and defect images by comparing the complexity of each of the multiple images,
   wherein higher frequencies or larger values of high frequencies appear on an FFT representation of the defect image compared to an FFT representation of the reference image, wherein subtracting FFT representations of the multiple images from each other results in difference images, and wherein a difference image having more positive values in a high frequency domain identifies a defect image.

5. A non-transitory program storage device readable by a machine, tangibly embodying a program of instructions executable by said machine to perform method steps to analyze a lithographic medium, the method steps comprising:
   accessing multiple images of the lithographic medium, the multiple images being undesignated as reference or defect images;
   aligning the multiple images;
   defining a common area of the multiple images;
   computing a complexity of each of the images, as defined by the common area, by performing at least a portion of a spatial frequency transform, the spatial frequency transform including generating a JPEG file; and designating the reference and defect images by comparing the complexity of each of the multiple images, wherein generating the JPEG file includes grouping pixels of each image into blocks, each block of pixels being transformed into another domain to generate a set of transform coefficients, which indicate unique blocks and instances of blocks, and wherein a defect image has one or more additional unique blocks compared to a reference image.

6. A non-transitory program storage device readable by a machine, tangibly embodying a program of instructions executable by said machine to perform method steps to analyze a lithographic medium, the method steps comprising:

accessing multiple images of the lithographic medium, the multiple images being undesignated as reference or defect images;

aligning the multiple images;

defining a common area of the multiple images;

computing a complexity of each of the images, as defined by the common area, by performing a set of steps for partitioning; and designating the reference and defect images by comparing the complexity of each of the multiple images, wherein partitioning includes dividing each image into blocks, the blocks being equal-sized, wherein duplicated blocks are exempt from further partitioning, wherein each unduplicated block is further partitioned into smaller blocks, the smaller blocks being equal-sized, wherein duplicated smaller blocks are exempt from further partitioning, wherein the partitioning continues until the reference image and the defect image are distinguished, each further partitioning having yet smaller blocks, wherein a defect image has a greater total number of all size blocks than a reference image.

7. A computer program product comprising:

a non-transitory computer usable storage device having a computer readable program code embodied therein for causing a computer to analyze a lithographic medium for defects, the computer readable program code comprising:

computer readable program code that accesses multiple images of the lithographic medium, the multiple images being undesignated as reference or defect images;

computer readable program code that aligns the multiple images;

computer readable program code that defines a common area of the multiple images;

computer readable program code that computes a complexity of each of the images, as defined by the common area, by performing at least a portion of a spatial frequency transform, the spatial frequency transform including generating a Fourier transform (FFT); and computer readable program code that automatically designates reference and defect images by comparing the complexity of each of the multiple images, wherein higher frequencies or larger values of high frequencies appear on an FFT representation of the defect image compared to an FFT representation of the reference image, wherein subtracting FFT representations of the multiple images from each other results in difference images, and wherein a difference image having more positive values in a high frequency domain identifies a defect image.

8. A computer program product comprising:

a non-transitory computer usable storage device having a computer readable program code embodied therein for causing a computer to analyze a lithographic medium for defects, the computer readable program code comprising:

computer readable program code that accesses multiple images of the lithographic medium, the multiple images being undesignated as reference or defect images;

computer readable program code that aligns the multiple images;

computer readable program code that defines a common area of the multiple images;

computer readable program code that computes a complexity of each of the images, as defined by the common area, by performing at least a portion of a spatial frequency transform, the spatial frequency transform including generating a JPEG file; and computer readable program code that automatically designates reference and defect images by comparing the complexity of each of the multiple images, wherein generating the JPEG file includes grouping pixels of each image into blocks, each block of pixels being transformed into another domain to generate a set of transform coefficients, which indicate unique blocks and instances of blocks, and wherein a defect image has one or more additional unique blocks compared to a reference image.

9. A computer program product comprising:

a non-transitory computer usable storage device having a computer readable program code embodied therein for causing a computer to analyze a lithographic medium for defects, the computer readable program code comprising:

computer readable program code that accesses multiple images of the lithographic medium, the multiple images being undesignated as reference or defect images;

computer readable program code that aligns the multiple images;

computer readable program code that defines a common area of the multiple images;

computer readable program code that computes a complexity of each of the images, as defined by the common area, by performing a set of steps for partitioning; and computer readable program code that automatically designates reference and defect images by comparing the complexity of each of the multiple images, wherein partitioning includes dividing each image into blocks, the blocks being equal-sized, wherein duplicated blocks are exempt from further partitioning, wherein each unduplicated block is further partitioned into smaller blocks, the smaller blocks being equal-sized, wherein duplicated smaller blocks are exempt from further partitioning, wherein the partitioning continues until the reference image and the defect image are distinguished, each further partitioning having yet smaller blocks, wherein a defect image has a greater total number of all size blocks than a reference image.

10. A system for analyzing a lithographic medium for defects, the system comprising:

means for accessing multiple images of the lithographic medium, the multiple images being undesignated as reference or defect images;

means for aligning the multiple images;

means for defining a common area of the multiple images;

means for computing a complexity of each of the images, as defined by the common area, by performing at least a portion of a spatial frequency transform, the spatial frequency transform including generating a Fourier transform (FFT); and means for designating the reference and defect images by comparing the complexity of each of the multiple images, wherein higher frequencies or larger values of high frequencies appear on an FFT representation of the defect image compared to an FFT representation of the reference image, wherein subtracting FFT representations of the multiple images from each other results in difference images, and wherein a difference image having more positive values in a high frequency domain identifies a defect image.

11. The system of claim 10, wherein the lithographic medium is a mask.

12. The system of claim 10, wherein the lithographic medium is a wafer.

* * * * *

UNITED STATES PATENT AND TRADEMARK OFFICE
CERTIFICATE OF CORRECTION

PATENT NO.            : 8,111,898 B2
APPLICATION NO.  : 10/313706
DATED                    : February 7, 2012
INVENTOR(S)          : Linyong Pang et al.

It is certified that error appears in the above-identified patent and that said Letters Patent is hereby corrected as shown below:

In the Claims:

Column 9
Line 51, amend "a" (second occurrence) to --the--.

Column 10
Line 4, amend "a" to --the--.
Line 5, amend "a" to --the--.
Line 29, amend "a" (first occurrence) to --the--.
Line 30, amend "a" to --the--.
Line 53, amend "a" (second occurrence) to --the--.

Column 11
Line 31, amend "the" (first occurrence) to --a--.
Line 31, amend "the" (second occurrence) to --a--.
Line 34, amend "a" (first occurrence) to --the--.
Line 35, amend "a" to --the--.
Line 58, amend "the" to --a--.
Line 59, amend "the" to --a--.
Line 63, amend "a" (second occurrence) to --the--.

Column 12
Line 54, amend "the" (first occurrence) to --a--.
Line 54, amend "the" (second occurrence) to --a--.
Line 57, amend "a" (first occurrence) to --the--.
Line 58, amend "a" to --the--.

Signed and Sealed this
Tenth Day of December, 2013

Margaret A. Focarino
*Commissioner for Patents of the United States Patent and Trademark Office*

CERTIFICATE OF CORRECTION (continued)
U.S. Pat. No. 8,111,898 B2

Column 13
Line 8, amend "the" to --a--.
Line 9, amend "the" to --a--.

Column 14
Line 3, amend "a" (second occurrence) to --the--.